United States Patent

Hong

[11] Patent Number: 6,140,180
[45] Date of Patent: Oct. 31, 2000

[54] METHOD OF FABRICATING STORAGE CAPACITOR FOR DYNAMIC RANDOM-ACCESS MEMORY

[75] Inventor: Gary Hong, Hsin-Chu, Taiwan

[73] Assignee: United Semiconductor Corporation, Taiwan

[21] Appl. No.: 09/054,837

[22] Filed: Apr. 3, 1998

[30] Foreign Application Priority Data

Dec. 12, 1997 [TW] Taiwan ................................. 86118759

[51] Int. Cl.$^7$ .............................................. H01L 21/8242
[52] U.S. Cl. ........................... 438/255; 438/398; 257/309
[58] Field of Search .................................... 438/255, 397, 438/398

[56] References Cited

U.S. PATENT DOCUMENTS 5,773,342  6/1998  Fukase ..................................... 438/255
5,872,041  2/1999  Lee et al. ................................. 438/397
5,902,124  5/1999  Hong ....................................... 438/255
5,930,641  7/1999  Pan ......................................... 438/398

*Primary Examiner*—Olik Chaudhuri
*Assistant Examiner*—William David Coleman
*Attorney, Agent, or Firm*—Christie, Parker & Hale, LLP

[57] ABSTRACT

A method of fabricating the storage capacitor for the memory cell units of DRAM IC devices is disclosed. The method is not constrained by the resolution limitations commonly seen in traditional photolithography. Self-aligned anisotropic procedure can be employed to form contact opening having reduced dimension. The smaller via formed in the opening can effectively prevent the situation in which the via is short-circuited with other components of the cell unit. Device fabrication yield rate can thus be improved.

9 Claims, 4 Drawing Sheets

METHOD OF FABRICATING STORAGE CAPACITOR FOR DYNAMIC RANDOM-ACCESS MEMORY

CROSS-REFERENCE TO RELATED APPLICATION

This application claims the priority benefit of Taiwan application serial no. 86118759, filed Dec. 12, 1997, the fill disclosure of which is incorporated herein by reference.

BACKGROUND OF THE INVENTION

1. Field of the Invention

This invention relates in general to the fabrication of semiconductor integrated circuit (IC) devices and, in particularly, to the fabrication of dynamic random-access memory (DRAM) IC devices. More particularly, this invention relates to the fabrication of storage capacitors for the memory cell units of DRAM IC devices.

2. Description of Related Art

FIG. 1 illustrates the schematic diagram of the circuit of a memory cell unit in the memory array of a typical DRAM device. As is illustrated, a transfer transistor T and a storage capacitor C constitute a basic memory cell unit for a DRAM. The source terminal of the transfer transistor T is connected to a corresponding bit line BL for the memory cell unit in the array, while the drain thereof is connected to one electrode 10 of the storage capacitor C. Gate electrode of the transfer transistor T is strobed by a word line WL of the memory array. Electrode 12 of the storage capacitor C opposite to electrode 10 is connected to a fixed electrical potential of the DRAM system, for example, the ground potential. Sandwiched between the electrodes 10 and 12 of the storage capacitor C is a layer of dielectric material 14.

FIG. 2 depicts the cross-sectional view of a conventional DRAM memory cell unit. In the illustrated configuration, although only one is seen in the drawing, a series of field oxide regions 21 are formed in the semiconductor substrate 20 for providing electrical insulation between active regions of consecutive memory cell units in the array. Over the surface of the field oxide 21, a gate structure is formed by subsequently forming a gate oxide layer 22, a polysilicon layer 23 and a cap oxide layer 24 and then patterning. Sidewall of this gate structure is covered by sidewall spacer 25 formed of deposited oxide. A self-aligned procedure then follows to form the source/drain regions 26a and 26b in the substrate 20, forming a cell unit MOS transistor. A polysilicon layer is then formed and patterned to contact one of the transistor source/drain regions 26b electrically which serves as the bit line 27 for the cell unit. In a blanket deposition procedure, an insulating layer 28 such as oxide then covers the substrate and the gate structure formed thereon. A photolithographic procedure then patterns the insulating layer 28 to form a self-aligned contact opening 29, which exposes one of the transistor source/drain regions 26a. The subsequent fabrication procedures then forms the bottom electrode for the cell unit storage capacitor.

Due to resolution limitations in photolithography, dimension of the contact opening 29 can not be made sufficiently small for typical DRAM memory cell units. This requires the reduction of the thickness of the insulation layer that isolates the gate electrode 23 from the conductive layer formed after the gate. Potential short-circuiting between the two deteriorates the yield rate of the DRAM devices fabricated.

Meanwhile, in the continuous effort of seeking to increase the charge-storing capacity of the cell unit storage capacitors for DRAM devices, other than utilizing materials with higher dielectric constant or controlling both the quality and thickness of the deposited dielectric layer, another straight-forward strategy is to increase the surface area of the capacitor electrodes. This efforts however, contradicts the tendency that cell units of DRAM devices are being made ever smaller as a result of increased fabrication resolution. The dilemma of making larger storage capacitor electrode surface area out of ever shrinking average capacitor die area has been a problem for DRAM fabrication design.

Conventional measures to increase the storage capacitor bottom electrode surface area has been to fabricate non-planar surface characteristics for the electrode. Configurations known as crown-, pillar-, fin-, tree- or cavity-shaped bottom electrodes have been made, and some are further added with a hemispherical-grain polysilicon (HSG-Si) layer over the electrode surface. All these are aimed at increasing the electrode surface area for the storage capacitor.

SUMMARY OF THE INVENTION

It is therefore an object of the present invention to provide a method of fabricating storage capacitor structure that employs a self-aligned etching procedure and is not constrained by the resolution limitations of conventional photolithography procedures.

The present invention achieves the above-identified object by providing a method of fabricating storage capacitor for a cell unit of a semiconductor DRAM device, wherein the device includes a substrate having a gate structure of the cell unit transistor formed thereon that serves as the bit line for the cell unit of the memory device, and the device further has a polysilicon word line electrically connected to the first of the source/drain regions of the transistor. The method includes the steps of first blanket-depositing a first insulating layer over the surface of the device substrate and covering the word line and the bit line. A first polysilicon layer is formed over the surface of the first insulating layer. The first polysilicon layer is patterned to form a first opening therein, with the first opening located substantially above the second of the source/drain regions of the transistor. An oxide layer is then formed covering the first polysilicon layer as well as filling into the first opening without completely filling it. The oxide layer and the insulating layer are then etched in a self-aligned procedure to form a second opening that exposes the surface of the second of the source/drain regions of the transistor. A second polysilicon is then formed over the surface of the first polysilicon layer and fills into the space of the second opening to be in electrical contact with the second of the source/drain regions of the transistor. The first and the second polysilicon layers are then patterned, and the combination of the first and second polysilicon layers constitutes the bottom electrode of the storage capacitor. A dielectric layer is then formed over the surface of the second polysilicon layer. A third polysilicon layer is then formed over the surface of the dielectric layer which is utilized as the top electrode of the storage capacitor.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DESCRIPTION OF THE PREFERRED EMBODIMENT

Figure 1:
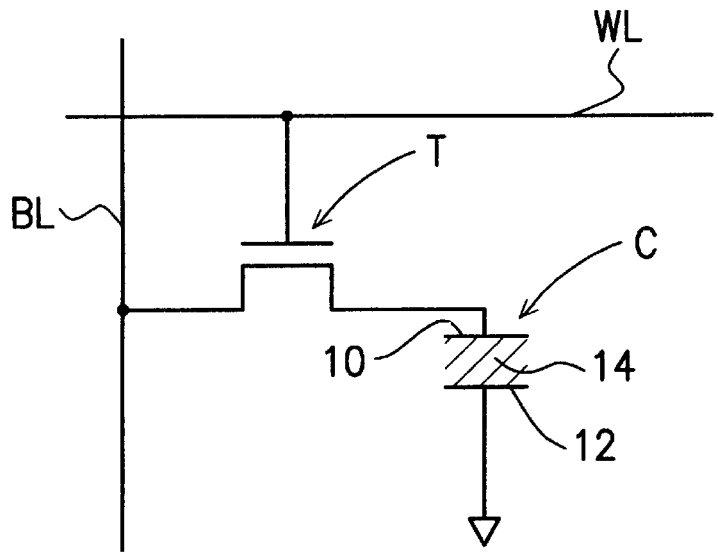
FIG. 1 illustrates the schematic diagram of the circuitry of a memory cell unit in the memory array of a typical DRAM device.
Figure 2:
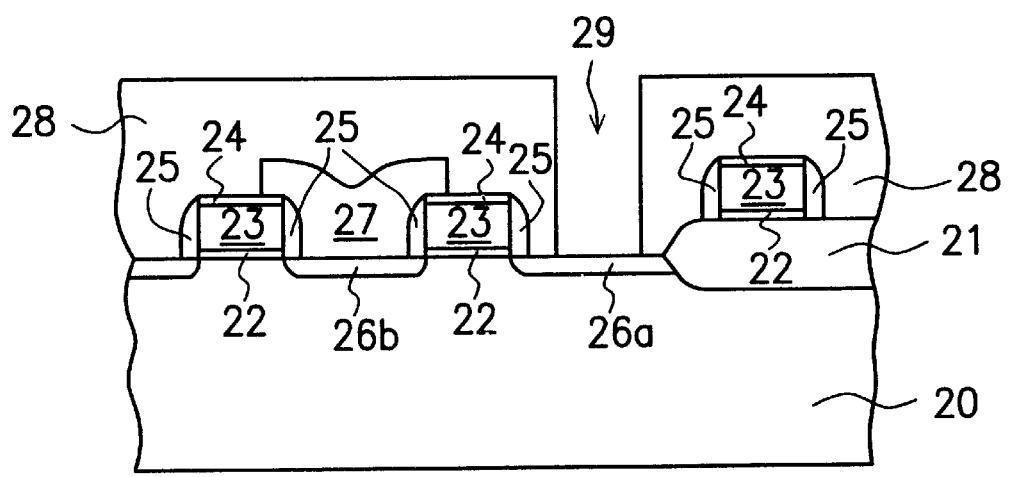
FIG. 2 depicts the cross-sectional view of a conventional DRAM memory cell unit.

Refer to FIGS. 3A–3F for a preferred embodiment of the invention for the fabrication of a DRAM memory cell unit. These cross-sectional views are depicted from the process stages which illustrate the characteristics of the process of the invention. First, with reference to FIG. 3A, an insulating structure 31 for the active region of a memory cell unit is formed in the substrate 30 of the DRAM device. This can be done by, for example, performing a thermal oxidation procedure in which a process of local oxidation of silicon (LOCOS) forms a field oxide layer having a thickness of about 3,000 Å. Or, a shallow trench can be formed in the device substrate to serve the same purpose of active region isolation between consecutive cell units.

Then, the wafer including the device substrate for the fabricated cell unit is sent into an oxidation chamber, in which a dry oxidation procedure can be performed to form a gate oxide layer 32 in a thermal oxidation procedure. This gate oxide layer 32 can be a silicon dioxide layer having a thickness of about 10018 250 Å that can also be used to protect the substrate from damages in the subsequent fabricational procedures.

A polysilicon layer 33 may then be formed in, for example, a low-pressure chemical vapor deposition (LPCVD) procedure that covers the surface of the ate oxide layer 32. A thermal diffusion or ion implantation procedure may then be employed to implant impurity ions in the polysilicon layer 33. This assists in lowering the electrical resistance of the polysilicon layer 33, thereby increasing its electrical conductivity. Typical thickness of the polysilicon layer is about 2,000~3,000 Å.

A layer of cap oxide 34 is then formed on top of the gate polysilicon layer 33. A photolithographic procedure then follows to pattern these formed layers and forms the gate structure for the cell unit MOS transistor. In the procedure, cap oxide layer 34, polysilicon layer 33 and the gate oxide layer 32 are subsequently etched.

Figure 3A:
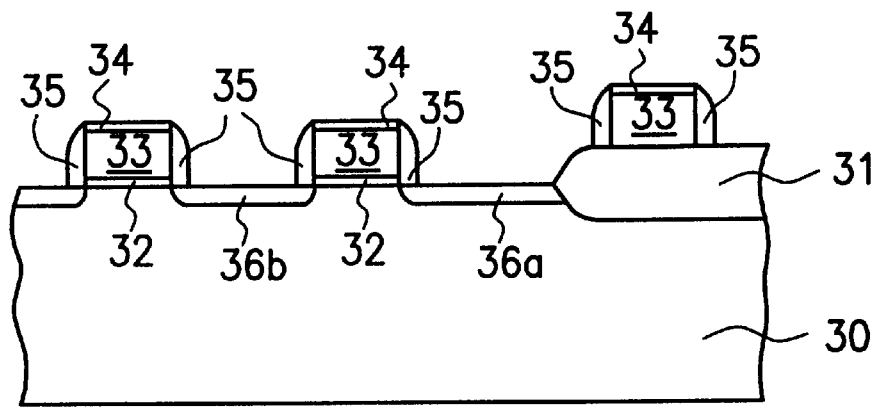
FIGS. 3A–3F depicts the cross-section views of a DRAM memory cell unit in the process stages of its fabrication in accordance with a preferred embodiment of the invention.

Then, a blanket-deposition procedure is employed to cover the device substrate at this stage with an oxide layer. This can be achieved in a CVD procedure, and the thickness of the blanket-deposited oxide layer is controlled at a level about the thickness of the sidewall spacer 35 to be formed on the sidewall of the gate structure. The sidewall spacer 35 is formed in an anisotropic etching procedure following the formation of the blanket-deposited oxide layer. Plasma of $CF_4$ or other fluorine-containing compound can be employed for performing the anisotropic etching. After the anisotropic etching procedure, sidewall spacers 35 such as illustrated in FIG. 3A is formed covering the sidewall of the gate structures. Cap oxide 34 and sidewall spacer 35 for the gate structure of the cell unit MOS transistor serves to isolate the transistor gate electrode from unnecessary electrical contact with other conductive structures formed in subsequent fabrication procedures.

A self-aligned ion implantation procedure employing the gate structure as the shielding mask then follows to implant ions of impurity into the substrate 30 in order to form source/drain regions 36a and 36b for the cell unit transistor. The ion implantation procedure may be performed at a concentration of about $10^{15}/cm^2$. Or, alternatively, before the formation of the sidewall spacer 35 for the gate structure, a self-aligned ion implantation procedure can be performed to form lightly-doped drain in the planned transistor source/drain regions, followed by the implementation of the heavy-concentration ion implantation procedure.

Figure 3B:
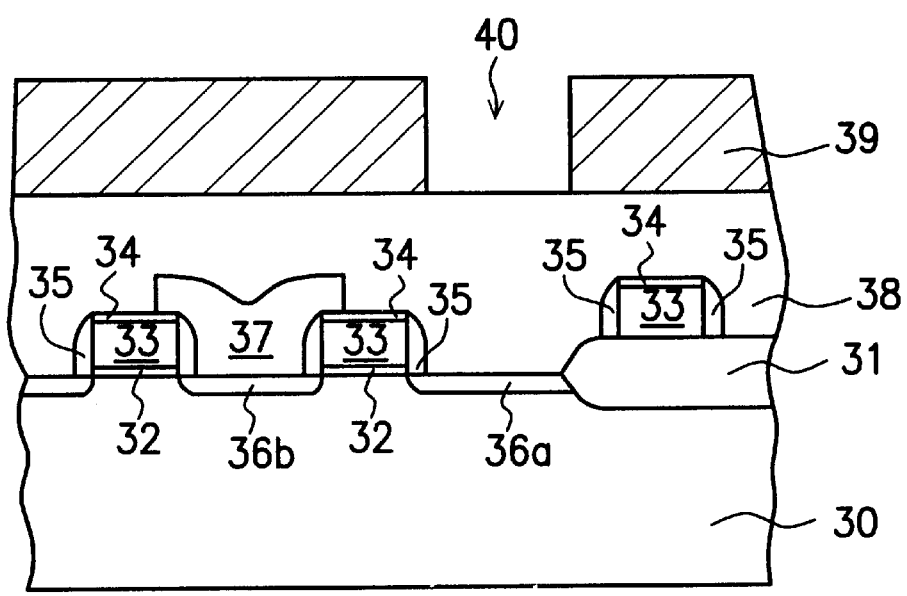

Refer to FIG. 3B, after the formation of the source/drain regions 36a and 36b for the cell unit MOS transistor, a layer of polysilicon is formed covering the device substrate 30 at this stage. The formed polysilicon layer contacts directly with one of the source/drain regions 36b electrically. After proper patterning in this polysilicon layer, bit line 37 is formed for the cell unit transistor. After the bit line 37 is formed, a plannarized insulating layer 38 may be deposited in a CVD procedure that covers the entire surface of the device substrate at this stage. This includes the gate structure 33, which also serves as the cell unit word line, and the bit line 37 electrically connected to the source/drain of the transistor. The insulating layer may be formed in an APCVD (atmospheric pressure CVD) or PECVD (plasma-enhanced CVD) procedure that deposits borophosilicate glass (BPSG) to feature a generally planar surface having a thickness of about 5,00018 20,000 Å.

A thermal reflow or CMP (chemical-mechanical polishing) procedure then follows to plannarized the surface of the deposited insulation layer 38. Plannarized surface of the insulating layer 38 assists in achieving more smooth in the subsequent fabricational procedures. Deposition quality may also be improved as a result of the insulation layer planarization. Then, a blanket-deposition procedure forms a polysilicon layer 39 on the surface of the insulation layer 38. This deposited polysilicon 39 may then be subject to impurity doping so as to improve the electrical conductivity thereof A photolithographic procedure then forms a contact opening 40 in the polysilicon layer that is substantially located above the corresponding source/drain region 36a of the cell unit transistor.

Figure 3C:
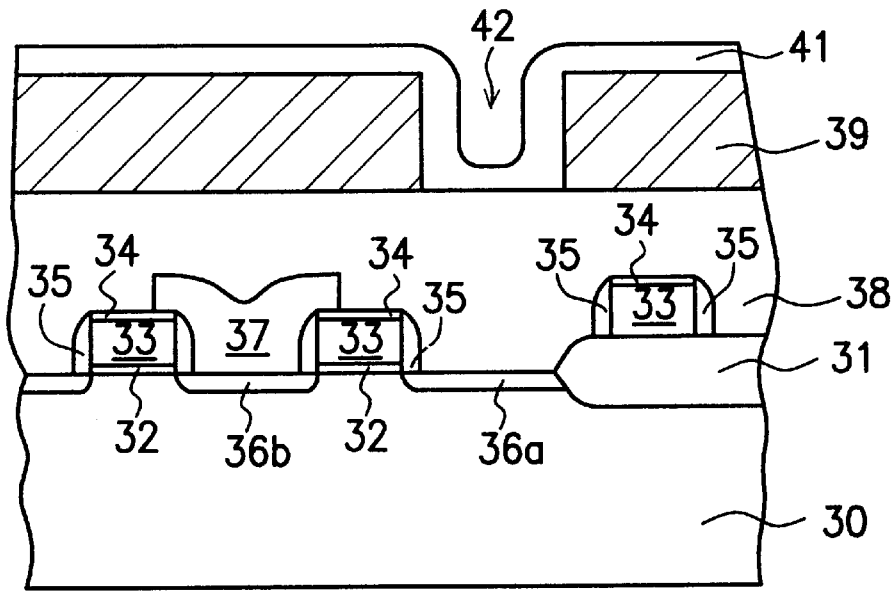
Figure 3D:
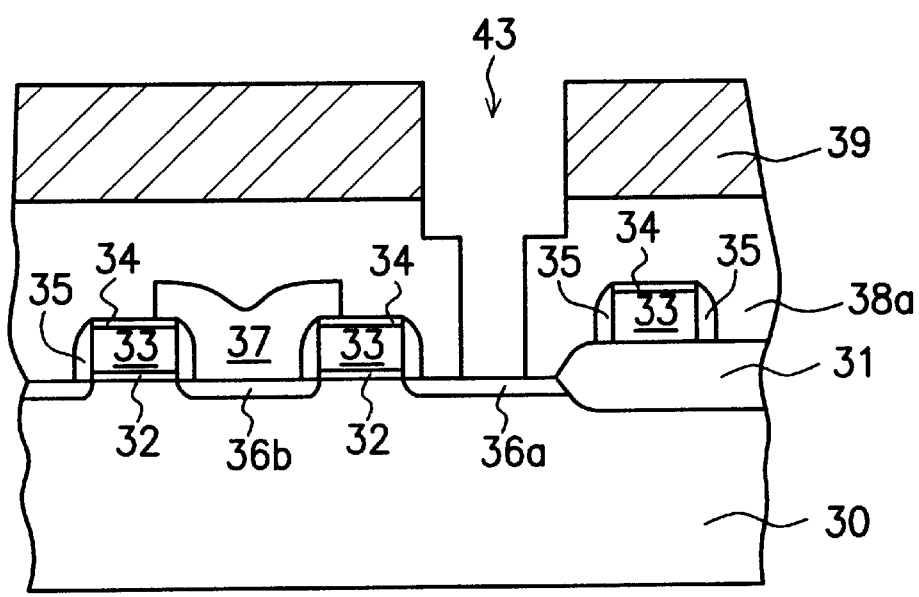

Refer to FIG. 3C. An oxide layer 41 is formed over the surface of the polysilicon layer 39. The oxide deposition also covers the exposed surface of the insulation layer 38 inside and at the bottom of the contact opening 40 (FIG. 3B). The sidewall of the contact opening is also covered by the oxide deposition. This can be achieved in a CVD procedure, in which the thickness of the deposited oxide layer 41 is about 300~3,000 Å. This thickness prevents the deposition of the oxide from filling entirely into the contact opening. Rather, after the deposition of the oxide layer 41, a new opening 42 is formed at the site where the contact opening 40 of FIG. 3B was located.

Then, an anisotropic etching procedure such as plasma etching may be employed to consume into the oxide layer 41. As a result of self-alignment, after the complete consumption of the oxide layer 41 over the surface of the device substrate at this stage, the polysilicon layer 39 is then used as a masking layer for further anisotropic etching into the insulation layer 38. The anisotropic etching is concluded when the surface of the transistor source/drain region 36a deeper down under is exposed. A configuration such as the one depicted in the cross-sectional view of FIG. 3D demonstrates that a newly-shaped contact opening 43 having a larger diameter at the upper section and a smaller one at the lower is now formed. The fact that such a contact opening 43 is formed in a self-aligned procedure indicates that the lower section of the opening 43 can be formed without concern of the resolution limitations of typical photolithography procedure. Since the lower section of the opening 43 is formed with a relatively smaller diameter, there is therefore reduced possibility that the via formed in the opening comes into undesirable electrical contact with the gate structure 33 and other structures of the cell unit. In other words, undesirable short-circuiting conditions are reduced effectively because of the reduced diameter of the contact opening 43. Effective fabrication yield rate improvement can thus be expected for DRAM devices employing the fabrication method of the invention.

Figure 3E:
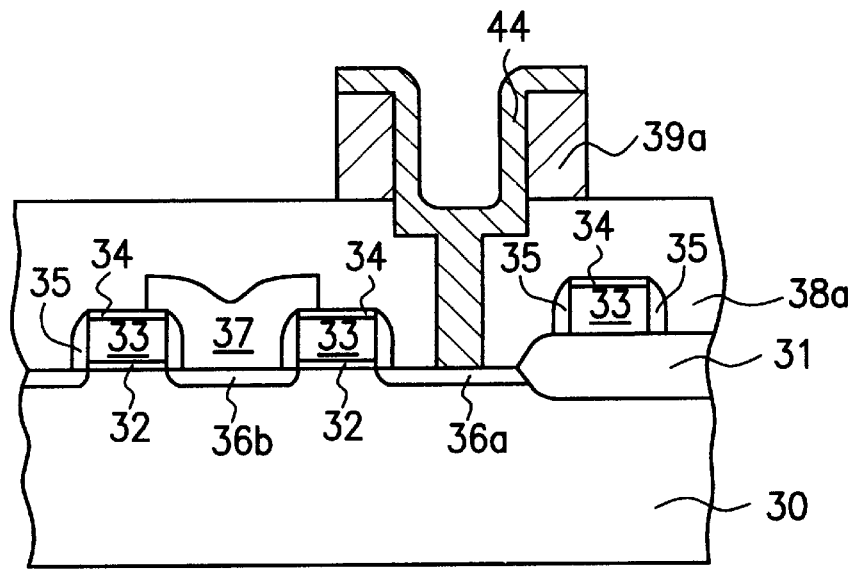
Figure 3F:
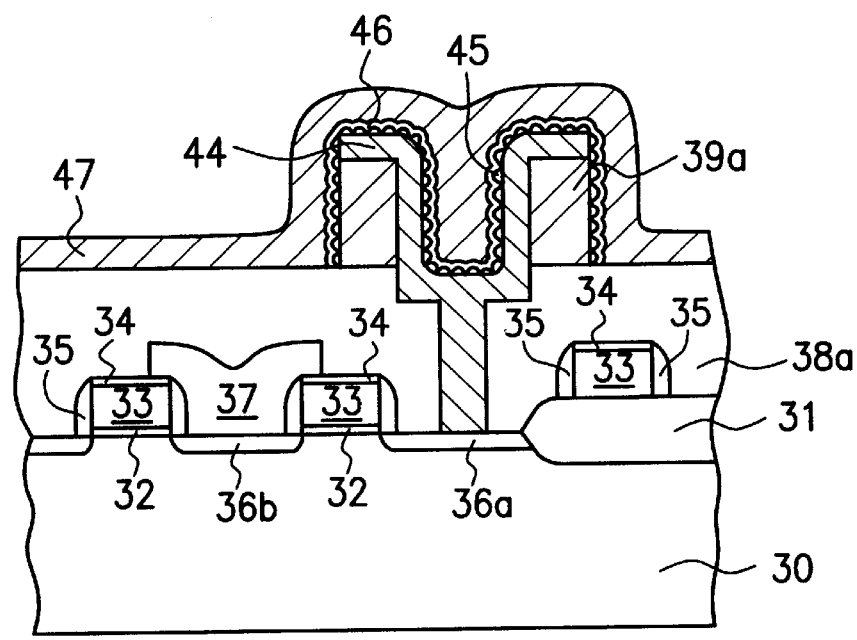

With reference to FIG. 3E, a second polysilicon layer 44 can now be formed that covers the surface of the first polysilicon layer 39 as well as fills into the opening 43. This second polysilicon layer 44 can be doped with impurities so as to improve its electrical conductivity. The combination of the first and the second polysilicon layers 39 and 44 can be patterned to form the construction as depicted in FIG. 3E for the capacitor bottom electrode. Further, the entire polysilicon structure (44 and 39a) can be shaped into either pillar-, fin- or cavity-shaped configuration that can enjoy increased surface area. In the case of the depicted embodiment, the deposition of the second polysilicon layer 44 in FIG. 3E did not completely fill the opening, 43 of FIG. 3D. A substantially concave space is still present inside the opening after the deposition concludes. This cavity-shaped configuration enjoys larger surface area than when the entire opening is filled completely. In the example of FIG. 3F, HSG-Si layer 45 is further formed over the surface of the second polysilicon layer 44. Surface area is thus increased further. The HSG-Si can be formed utilizing any of several available methods. For example, an LPCVD procedure employing a silane gaseous supply can be used to deposit the HSG-Si layer. The reaction temperature may be controlled to be in the range of about 550~595° C., and the atmospheric pressure maintained in the range of about 0.2~0.5 torr.

After the formation of the HSG-Si layer 45, a dielectric layer 46 can then be formed on top of the HSG-Si layer. The dielectric used may, for example, be a multiple-layered NO (nitride-oxide) structure. Materials with higher dielectric constant such as $Ta_2O_5$ or provskie dielectrics may also be applicable.

After the dielectric layer is formed over the bottom electrode of the storage capacitor for the cell unit, a third polysilicon layer 47 may now be formed. This third polysilicon layer 47 constitutes the top electrode for the storage capacitor and may be formed in, for example, an LPCVD procedure. Additional doping or ion implantation procedure can be implemented and followed by an annealing processing. These measures improves the electrical conductivity characteristics in the top electrode of the storage capacitor. After the third polysilicon layer 47 is formed, a proper patterning procedure can be implemented to shape the top electrode, thereby effectively concluding the fabrication of the storage capacitor for the DRAM device cell unit.

While the invention has been described by way of example and in terms of preferred embodiment, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of fabricating storage capacitor for a cell unit of a semiconductor dynamic random-access memory device, the device includes a substrate having a gate structure of the cell unit transistor formed thereon that serves as the bit line for the cell unit of the memory device, and the device further having a polysilicon word line electrically connected to the first of the source/drain regions of the transistor, the method comprising the steps of:

blanket-depositing a first insulating layer over the surface of the device substrate and covering the word line and the bit line;

forming a first polysilicon layer over the surface of the first insulating layer;

patterning the first polysilicon layer to form a first opening therein, the first opening being located substantially above the second of the source/drain regions of the transistor;

forming an oxide layer covering the first polysilicon layer as well as filling into the first opening without completely filling the first opening;

etching into the oxide layer and the insulating layer in a self-aligned procedure to form a second opening that exposes the surface of the second of the source/drain regions of the transistor;

forming a second polysilicon layer over the surface of the first polysilicon layer and filling into the space of the second opening to be in electrical contact with the second of the source/drain regions of the transistor;

patterning the first and the second polysilicon layers, and the combination of the first and second polysilicon layers constituting the bottom electrode of the storage capacitor; and forming a dielectric layer, which has a nitride-oxide multiple-layered configuration, over the surface of the second polysilicon layer, and further forming a third polysilicon layer over the surface of the dielectric layer, with the third polysilicon layer being utilized as the top electrode of the storage capacitor.

2. A method according to claim 1, wherein the insulating layer has a thickness in the range of about 5,000~20,000 Å.

3. A method according to claim 1, wherein the insulating layer is an oxide layer.

4. A method according to claim 1, wherein the oxide layer has a thickness in the range of about 300~3,000 Å.

5. A method according to claim 1, wherein a hemispherical-grain polysilicon layer is formed over the surface of the bottom electrode before the step of forming dielectric layer is performed.

6. A method according to claim 1, wherein the first and second polysilicon can be further shaped into pillar-, fin- and/or cavity-shaped configuration for increasing the surface area of the bottom electrode of the storage capacitor.

7. A method according to claim 1, wherein the step of etching into the oxide layer employs the first polysilicon layer as the shielding mask for performing etching.

8. A method according to claim 1, wherein the step of etching into the oxide layer comprises an anisotropical etching procedure.

9. A method of fabricating storage capacitor for a cell unit of a semiconductor dynamic random-access memory device, the device includes a substrate having a gate structure of the cell unit transistor formed thereon that serves as the bit line for the cell unit of the memory device, and the device further having a polysilicon word line electrically connected to the first of the source/drain regions of the transistor, the method comprising the steps of:

blanket-depositing a first insulating layer over the surface of the device substrate and covering the word line and the bit line;

forming a first polysilicon layer over the surface of the first insulating layer;

patterning the first polysilicon layer to form a first opening therein, the first opening being located substantially above the second of the source/drain regions of the transistor;

forming an oxide layer covering the first polysilicon layer as well as filling into the first opening without completely filling the first opening;

etching into the oxide layer and the insulating layer in a self-aligned procedure using the first polysilicon layer as the shielding mask to form a second opening that exposes the surface of the second of the source/drain regions of the transistor;

forming a second polysilicon layer over the surface of the first polysilicon layer and filling into the space of the second opening to be in electrical contact with the second of the source/drain regions of the transistor;

patterning the first and the second polysilicon layers, and the combination of the first and second polysilicon layers constituting the bottom electrode of the storage capacitor; and forming a dielectric layer over the surface of the second polysilicon layer, and further forming a third polysilicon layer over the surface of the dielectric layer, with the third polysilicon layer being utilized as the top electrode of the storage capacitor.

* * * * *